United States Patent Office 3,055,962
Patented Sept. 25, 1962

3,055,962

THERMOELECTRIC MATERIALS

John B. Conn, Westfield, N.J., assignor to Merck & Co., Inc., Rahway, N.J., a corporation of New Jersey No Drawing. Filed Nov. 25, 1960, Ser. No. 71,437
2 Claims. (Cl. 136—5)

This invention relates to themoelectric materials and more particularly to thermoelectric alloys having physical properties useful in thermoelectric devices.

It is known in the art that thermoelectric materials offer considerable promise in device application, particularly in cooling and power generating devices. For example, when two wires of dissimilar thermoelectric compositions have their ends joined so as to form a continuous loop, a pair of junctions is established by the respective ends so joined. If the two junctions are at different temperatures, an electromotive force will be set up in the circuit thus formed. This effect is called the thermoelectric or Seebeck effect and the device is called a thermocouple. This effect may be used as a means for making batteries or generators.

Thermoelectric materials may be classified as either N-type or P-type depending upon the direction of current flow across the cold junction formed by the thermoelectric material and another element when operating as a thermoelectric generator according to the Seebeck effect. If the positive current direction at the cold junction is from the thermoelectric material, then it is termed a P-type thermoelectric material. Conversely, if the positive current direction is from the cold junction and toward the thermoelectric material, it is termed an N-type thermoelectric material.

There are three fundamental requirements for desirable thermoelectric materials. The first requirement is a high electromotive force per degree of temperature difference between the junctions. This is referred to as the thermoelectric power of the material. The second necessity is a low heat conductivity since it would be difficult to maintain either high or low temperatures at a junction if the material conducted heat too readily. The third requisite is high electrical conductivity or, conversely, low electrical resistivity. This is apparent since the temperature between junctions will not be great if the current passing through the circuit generates high Joulean heat.

An approximation of the quality of a thermoelectric material may be made by relating these three factors and by taking Z as an approximate figure of merit, expressing it as $$Z=S^2/\rho K$$

where S is the Seebeck coefficient in microvolts/degree Kelvin ($\mu$v./° K.) which relates to thermal E.M.F. of a thermoelectric material with respect to copper or lead, $\rho$ is the electrical resistivity in ohm-cm. and K is the thermal conductivity in watts/cm. degree.

An object of the present invention is to provide improved thermoelectric materials having high figures of merit.

Another object of the instant invention is to provide thermoelectric alloys exhibiting a high figure of merit which are relatively simple to prepare.

The thermoelectric materials of the present invention have the general formula: $Bi_{24}M_{60-X}N_{2+Y}Te_{150-X-Y}$ where M is a Group V element, such as antimony and arsenic, N is a Group VI element including selenium and sulfur, X ranges from −8 to +12 and Y from 0 to +10. In a preferred form the thermoelectric materials have the general formula: $Bi_{24}Sb_{60-X}Se_6Te_{150-X}$ where X ranges from −8 to +12. A thermoelectric material having an optimum figure of merit according to the present invention is provided at $X=+8$ in the latter formula.

The thermoelectric compounds of the present invention may be prepared by reacting at elevated temperatures a mixture of the elemental constituents of the compound in proportions corresponding to the desired composition. For example, to prepare $Bi_{24}Sb_{68}Se_6Te_{142}$, 15.7 g. bismuth, 25.9 g. antimony, 1.5 g. selenium and 56.9 g. tellurium, corresponding to said formula, are mixed together. In a preferred method of preparation the elements are loaded into carbon-coated quartz tubes which are evacuated to about 1 micron and sealed. The tubes are then placed in horizontal furnaces at about 750° C. and heated for about one hour. Then the constituents are agitated thoroughly by rocking the furnaces and the contents are allowed to cool to room temperature forming ingots of the compound. The resulting ingots are then placed in an uncoated quartz crystallization tube and resealed at about 1 micron. The crystallization tube is positioned in a zone-leveling apparatus which consists of a wire-wound quartz tube furnace surrounded by a Nichrome zone heating coil. The zone heater is attached to a carriage and pulled up an inclined track. During the zoning operation, the quartz reaction tube containing the sample is suspended in a main furnace which is kept at 400–450° C. to prevent tellurium condensation. The zone heater then is set at 650° C. and pulled along the length of the sample at a predetermined rate. The operation may be carried out in both vertical and horizontal positions. According to a preferred practice the sample is first given one or two rapid zone passes raversing the sample at the rate of about 6 inches per hour. Thereafter two or three zone passes are made at the slower rate of about 2.5 inches per hour. Each pass is made in a direction opposite to the proceeding one and arranged so that the last pass is from bottom to top of the ingot.

While we have described above in detail a preferred method for preparing the thermoelectric compounds of the present invention which achieves a more uniform resistivity profile in the resulting ingot, it will be understood by those skilled in the art that other preparative techniques well known for such materials, may be used as well. For example, the melted alloy may be crystallized by lowering the reaction tube vertically from the heated zone at a suitable rate. Other crystallization techniques will present themselves to the art as being suitable for the preparation of the alloy compositions described herein.

Following the zone leveling method described above, a series of multi-component P-type thermoelectric alloy compositions of the preferred embodiment of the invention was prepared having the general formula:

$$Bi_{24}Sb_{60+X}Se_6Te_{150-X}$$

wherein X varies from −8 to +12. The thermoelectric properties of these compounds are summarized in Table 1 below:

*Table I*

| X | S$\mu$v./K.° | $\rho\times10^4$ ohm-cm. | K. watt/cm.-deg. | $Z\times10^{3}$/deg. |
|---|---|---|---|---|
| −8 | +150 | 12.5 | 0.0120 | 1.8 |
| −6 | +152 | 12.0 | 0.0125 | 2.1 |
| −4 | +170 | 12.7 | 0.0135 | 2.4 |
| −2 | +180 | 12.8 | 0.0145 | 2.3 |
| 0 | +200 | 14.0 | 0.0155 | 1.6 |
| +2 | +205 | 16.0 | 0.0160 | 1.8 |
| +4 | +210 | 12.0 | 0.0140 | 2.4 |
| +6 | +208 | 11.0 | 0.0128 | 3.0 |
| +8 | +205 | 10.0 | 0.0115 | 4.3 |
| +10 | +190 | 9.0 | 0.0120 | 3.6 |
| +12 | +150 | 6.2 | 0.0140 | 2.6 |

From the above table it is apparent that the Seebeck coefficient of the thermoelectric compounds of the present invention attains a flat maximum in the range $X=-1$ to +10, while the resistivity shows a sharp peak at $X=+2$. On the other hand thermal conductivity is at a maximum at $X=0$ to +2 and at a minimum at $X=+6$ to +8. The combination of these factors leads to a maximum in the figure of merit in the neighborhood of $X=+8$ represented by the formula: $Bi_{24}Sb_{68}Se_6Te_{142}$.

While we have described a preferred alloy system wherein improved thermoelectric properties are provided, certain composition changes involving the ratio of selenium to tellurium may be made without departing from the invention. For example, the Se/Te ratio may be varied in, for example, compound $Bi_{24}Sb_{68}Se_6Te_{142}$ to provide improved thermoelectric alloys having the general formula: $Bi_{24}Sb_{68}Se_{2+Y}Te_{146-Y}$, where Y ranges from 0 to +10. As shown in Table II, the selenium content may be varied over the range of $Se_2$ to $Se_{12}$ with a corresponding change in tellurium from $Te_{146}$ to $Te_{136}$ to provide thermoelectric materials with similarly favorable physical properties.

*Table II*

| Se/Te | Sμv./K.° | ρ×10⁴ ohm-cm. | K. watt/cm.-deg. | Z×10³/deg. |
|---|---|---|---|---|
| 2/146 | +174 | 8.7 | 0.0127 | 2.7 |
| 4/144 | +185 | 10.4 | 0.0104 | 3.2 |
| 4.5/143.5 | +198 | 10.0 | 0.0124 | 2.4 |
| 5/143 | +200 | 10.9 | 0.0123 | 2.8 |
| 5.5/142.5 | +210 | 10.4 | 0.0105 | 2.9 |
| 6/142 | +210 | 11.0 | 0.0128 | 4.3 |
| 8/140 | +208 | 13.7 | 0.0102 | 2.9 |
| 10/138 | +197 | 14.4 | 0.0104 | 2.6 |
| 12/136 | +213 | 19.0 | 0.0097 | 2.5 |

It is apparent from the above table that increasing the selenium content increases the resistivity, decreases the thermal conductivity, and has but little effect on the Seebeck coefficient. Decreasing the selenium content lowers the Seebeck coefficient and resistivity while increasing the conductivity. The maximum figure of merit remains in the vicinity of a 6/142 ratio of Se/Te.

While we have described a preferred alloy system of bismuth, antimony, selenium and tellurium it may be noted other elements of Group V in the periodic table, such as arsenic, $As^{5+}$ may be substituted in whole or in part for antimony to provide similar N-type thermoelectric materials. Also other elements of Group VI of the periodic table, such as sulfur, $S^{6+}$ may be substituted in whole or in part for selenium with no marked change in the Seebeck coefficient or resistivity of the base system.

The electronic structure of the alloy system of the present invention is still not well understood, but it is believed that antimony exists both in the +5 and +3 states. For example, in the alloy system in which X is 0 there are 30 $Sb^{+5}$ atoms and 30 $Sb^{+3}$ atoms per unit cell of the crystal, i.e., $Bi_{24}Sb_{30}{}^{+3}Sb_{30}{}^{+5}Se_{60}Te_{150}$, so that the total valency of the compound is maintained in a stoichiometric relationship.

What has been described herein are novel thermoelectric compounds which possess high figures of merit, including low thermal conductivities with correspondingly high electrical conductivities. Within certain limits it has been shown that the system is able to accept foreign atoms without marked disturbance on the thermoelectric properties of the system.

While the invention has been described with particular reference to certain embodiments thereof, it will be readily understood by those skilled in the art that various substitutes may be made without departing from the spirit and scope of the invention.

What is claimed is:

1. P-type thermoelectric materials of a high figure of merit having the general formula: $Bi_{24}Sb_{60+X}Se_6Te_{150-X}$ wherein X ranges from +6 to +10.

2. A P-type thermoelectric material of a high figure of merit having the general formula: $Bi_{24}Sb_{68}Se_6Te_{142}$.

References Cited in the file of this patent

UNITED STATES PATENTS 2,762,857 Lindenblad ............ Sept. 11, 1956
2,957,937 Jensen et al. ............ Oct. 25, 1960

OTHER REFERENCES

Goldsmid et al.: German application, 1,054,519, printed April 9, 1959, (Kl. 21b 27/03).

ASTIA, AD 245,070, October 31, 1960, page 101.